United States Patent
Damiano, Jr. et al.

(10) Patent No.: US 11,476,083 B2
(45) Date of Patent: Oct. 18, 2022

(54) ELECTRICAL DEVICES WITH EDGE SLITS FOR MOUNTING SAMPLE

(71) Applicant: Protochips, Inc., Morrisville, NC (US)

(72) Inventors: John Damiano, Jr., Apex, NC (US); Hessam Ghassemi, Morrisville, NC (US); Ian Patrick Wellenius, Morrisville, NC (US); Rémy Berthier, Morrisville, NC (US)

(73) Assignee: PROTOCHIPS, INC., Morrisville, NC (US)

( * ) Notice: Subject to any disclaimer, the term of this patent is extended or adjusted under 35 U.S.C. 154(b) by 540 days.

(21) Appl. No.: 16/491,057

(22) PCT Filed: Mar. 13, 2018

(86) PCT No.: PCT/US2018/022136
§ 371 (c)(1),
(2) Date: Sep. 4, 2019

(87) PCT Pub. No.: WO2018/169927
PCT Pub. Date: Sep. 20, 2018

(65) Prior Publication Data
US 2020/0020505 A1    Jan. 16, 2020

Related U.S. Application Data

(60) Provisional application No. 62/471,133, filed on Mar. 14, 2017.

(51) Int. Cl.
*H01J 37/244*    (2006.01)
*H01J 37/20*    (2006.01)
*H01J 37/26*    (2006.01)

(52) U.S. Cl.
CPC ............ *H01J 37/244* (2013.01); *H01J 37/20* (2013.01); *H01J 37/26* (2013.01); *H01J 2237/2008* (2013.01); *H01J 2237/24564* (2013.01)

(58) Field of Classification Search
CPC .......... H01J 37/244; H01J 37/20; H01J 37/26; H01J 2237/2008; H01J 2237/24564
See application file for complete search history.

(56) References Cited

U.S. PATENT DOCUMENTS

| 4,802,277 A | 2/1989 | Root |
| 5,280,178 A | 1/1994 | Engelen et al. |

(Continued)

FOREIGN PATENT DOCUMENTS

| EP | 1587128 A1 | 10/2005 |
| JP | 2014002987 A | 1/2014 |

OTHER PUBLICATIONS

ISA/KR; International Search Report and Written Opinion for International Patent Application No. PCT/US18/22136 dated Jun. 29, 2018, 8 pages.

(Continued)

*Primary Examiner* — Christopher P McAndrew
*Assistant Examiner* — Zannatul Ferdous
(74) *Attorney, Agent, or Firm* — NK Patent Law

(57) ABSTRACT

An electrical device for electrically measuring a sample during electron microscope imaging includes: a chip through which a slit is defined, the chip having at least one peripheral edge, the slit having an open end at the at least one peripheral edge; an electrically conductive first contact on the chip; and an electrically conductive second contact on the chip; wherein the slit is at least partially positioned between the first contacts and second contact. An electrically conductive first wire may extend along the chip electrically (Continued)

connected to the first contact; and an electrically conductive second wire may extend along the chip electrically connected to the second contact. The first wire and second wire may diverge from each other in extending along the chip away from the slit.

17 Claims, 11 Drawing Sheets

(56) References Cited

U.S. PATENT DOCUMENTS

| | | | |
|---|---|---|---|
| 6,366,100 | B1 | 4/2002 | Ito et al. |
| 7,566,884 | B2 | 7/2009 | Deguchi et al. |
| 7,586,105 | B2 | 9/2009 | Molhave |
| 8,637,836 | B1 | 1/2014 | Ott et al. |
| 9,279,753 | B2 | 3/2016 | Espinosa et al. |
| 2002/0061662 | A1 | 5/2002 | Boggild |
| 2004/0013951 | A1 | 1/2004 | Wang |
| 2007/0278420 | A1 | 12/2007 | Molhave |
| 2014/0353499 | A1 | 12/2014 | Terada et al. |
| 2015/0055301 | A1* | 2/2015 | So .................. H01L 23/473 |
| | | | 361/701 |
| 2015/0270199 | A1* | 9/2015 | Sunaga ............ H01L 23/49524 |
| | | | 257/288 |
| 2017/0089957 | A1* | 3/2017 | Takada ................ H01L 29/7815 |
| 2018/0012878 | A1* | 1/2018 | Patel .................... H01L 21/4871 |

OTHER PUBLICATIONS

WIPO, International Preliminary Report on Patentability for International Patent Application No. PCT/US18/22136, dated Sep. 17, 2019, 6 pages.
"Lightning Series—In Situ Biasing & Heating Solutions for TEM Platforms." Solutions for In Situ Microscopy. DENS Solutions. 2015.
Kim, J. K. et al. 2015. "Surface-adaptable all-metal micro-four-point probe with unique configuration." Journal of Micromechanics and Microengineering. p. 1-8. vol. 25. IOP Publishing.
Keller, S. et al. 2005. "Microscopic four-point probe based on SU-8 cantilevers." Review of Scientific Instruments. p. 125102-125102-4. vol. 76. American Institute of Physics.
Mulders, J. J. L. "An in-situ four-point probe method for the electrical characterization of beam induced depositions." Kleindiek nanotechnik. p. 1-4.

* cited by examiner

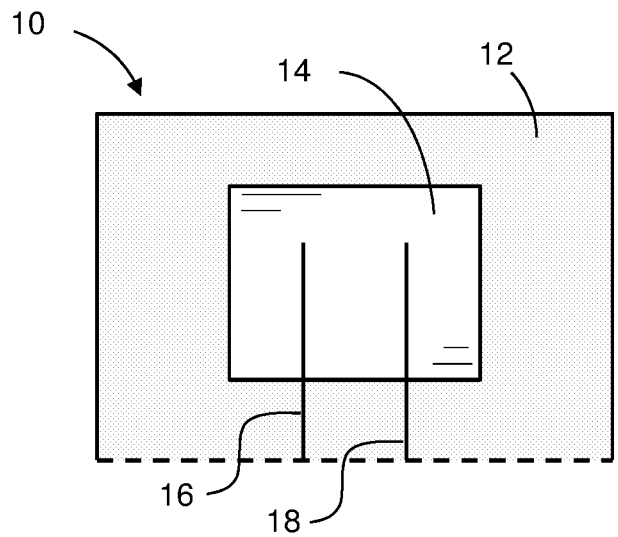
FIG. 1A *PRIOR ART*
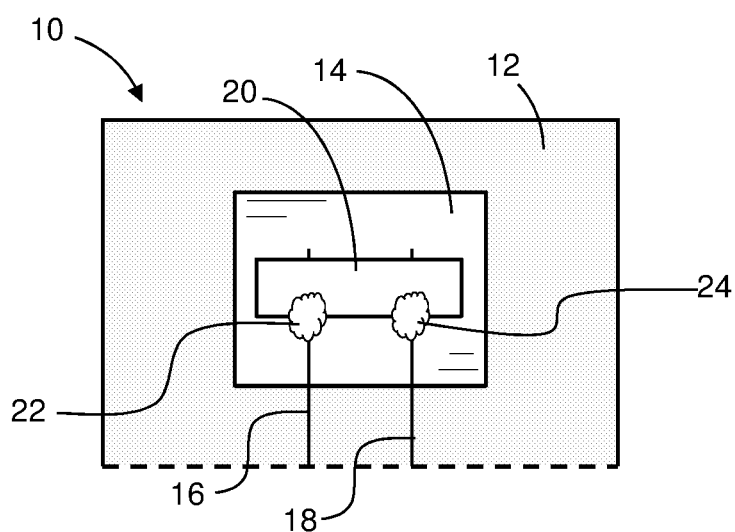
FIG. 1B *PRIOR ART*

ELECTRICAL DEVICES WITH EDGE SLITS FOR MOUNTING SAMPLE

CROSS-REFERENCE TO RELATED APPLICATIONS

This application is a U.S. National Stage application of International Patent Application No. PCT/US18/22136, titled "ELECTRICAL DEVICES WITH EDGE SLITS FOR MOUNTING SAMPLE", filed on Mar. 13, 2018, which claims the benefit of priority of U.S. provisional patent application No. 62/471,133, titled "Electrical Devices with Edge Slits for Mounting Sample," filed on Mar. 14, 2017, the entire contents of which are all hereby incorporated herein by reference.

TECHNICAL FIELD

The present disclosure relates to electrical devices for use in electrically stimulating and characterizing a sample during electron microscope imaging. More particularly, the present disclosure relates to an electrical device optimized for sample mounting and for establishing electrical connections to the sample using FIB (focused ion beam).

BACKGROUND

A typical electrical device for use in electrically stimulating and characterizing a sample during electron microscope imaging includes a membrane framed by a thicker support chip and electrically conducting wires mounted on the membrane. A sample is typically placed over the membrane across the wires. In some cases, the sample is cut or altered by a focused ion beam (FIB). In many cases, the sample is electrically connected to the wires by FIB metal deposition. Whether deposited during cutting of the sample, or during the electrical connection FIB process, inadvertent metallization of the membrane or surrounding portions of the chip can occur, creating unwanted electrical shorts or circuit paths that cause electrical leaking around the sample and compromise electrical testing intended as through the mounted sample.

Improvements in electrical devices for use in electrically stimulating and characterizing a sample during electron microscope imaging, and improvements in methods of their manufacture, are needed.

SUMMARY

This summary is provided to introduce in a simplified form concepts that are further described in the following detailed descriptions. This summary is not intended to identify key features or essential features of the claimed subject matter, nor is it to be construed as limiting the scope of the claimed subject matter.

In at least one embodiment, an electrical device for electrically measuring a sample during electron microscope imaging includes: a chip through which a slit is defined, the chip having at least one peripheral edge, the slit having an open end at the at least one peripheral edge; an electrically conductive first contact on the chip; and an electrically conductive second contact on the chip; wherein the slit is at least partially positioned between the first contacts and second contact.

An electrically conductive first wire may extend along the chip electrically connected to the first contact; and an electrically conductive second wire may extend along the chip electrically connected to the second contact. The first wire and second wire may diverge from each other in extending along the chip away from the slit.

An electrically conductive first pad electrically may be connected to the first contact through the first wire; and an electrically conductive second pad may be electrically connected to the second contact through the second wire. The first wire and second wire may extend away from the slit in opposite directions relative to each other.

The electrical device may have a rectangular shape defined by: the at least one peripheral edge defining a linear peripheral first edge; a linear peripheral second edge parallel to the first edge; a linear peripheral third edge perpendicular to the first and second edges; and a linear peripheral fourth edge parallel to the third edge. The first edge, the second edge, the third edge, and the fourth edge together may define a rectangular peripheral outer boundary of the chip interrupted only by the open end of the slit.

The at least one peripheral edge may be linear and may define a forward-most portion of the electrical device having a first length. The electrical device may include a second linear peripheral edge, which is parallel to the at least one peripheral edge and defines a rearward-most portion of the electrical device having a second length. The first length and the second length may be essentially the same. The at least one peripheral edge may be interrupted along the first length only by the open end of the slit.

The slit may have two opposing parallel sides and may terminate at a closed end. The slit may be defined entirely through the chip and define a material void.

In at least one example, the chip includes a planar first surface, and an opposite planar second surface parallel to the first surface, and the slit defined through the chip is open at the first surface and second surface. The slit may expand from the first surface to the second surface. The first contact and second contact may be mounted on or over the first surface. Between the first and second surface, the slit may be defined between sloped planar side walls.

An electrically conductive third contact and an electrically conductive fourth contact may be positioned on the chip with the slit at least partially between the third and fourth contact.

The first and second contacts may be essentially parallel to the slit. The third and fourth contacts may be essentially perpendicular to the slit.

In at least one embodiment, a method of manufacturing an electrical device for electrically measuring a sample during electron microscope imaging includes: providing a first chip; removing a central portion of the chip to define a first slit therethrough, the first slit framed by the first chip; and cutting the first chip into a second chip and third chip by cutting the first chip along a line that passes through the first slit, such that a first portion of the first slit becomes a second slit at an edge of the second chip and a second portion of the first slit becomes a third slit at an edge of the third chip. In at least one example, removing a central portion of the first chip comprises etching away a membrane.

BRIEF DESCRIPTION OF THE DRAWINGS

The previous summary and the following detailed descriptions are to be read in view of the drawings, which illustrate particular exemplary embodiments and features as briefly described below. The summary and detailed descriptions, however, are not limited to only those embodiments and features explicitly illustrated.

FIG. 1A is a plan view of a sample testing portion of an electrical device, representative of the prior art, for use in electrically characterizing a sample during electron microscope imaging.

FIG. 1B is a plan view of a sample placed across the electrical device of FIG. 1A and electrically conducting formations deposited to assure electrical contact.

DETAILED DESCRIPTIONS

Figure 2A:
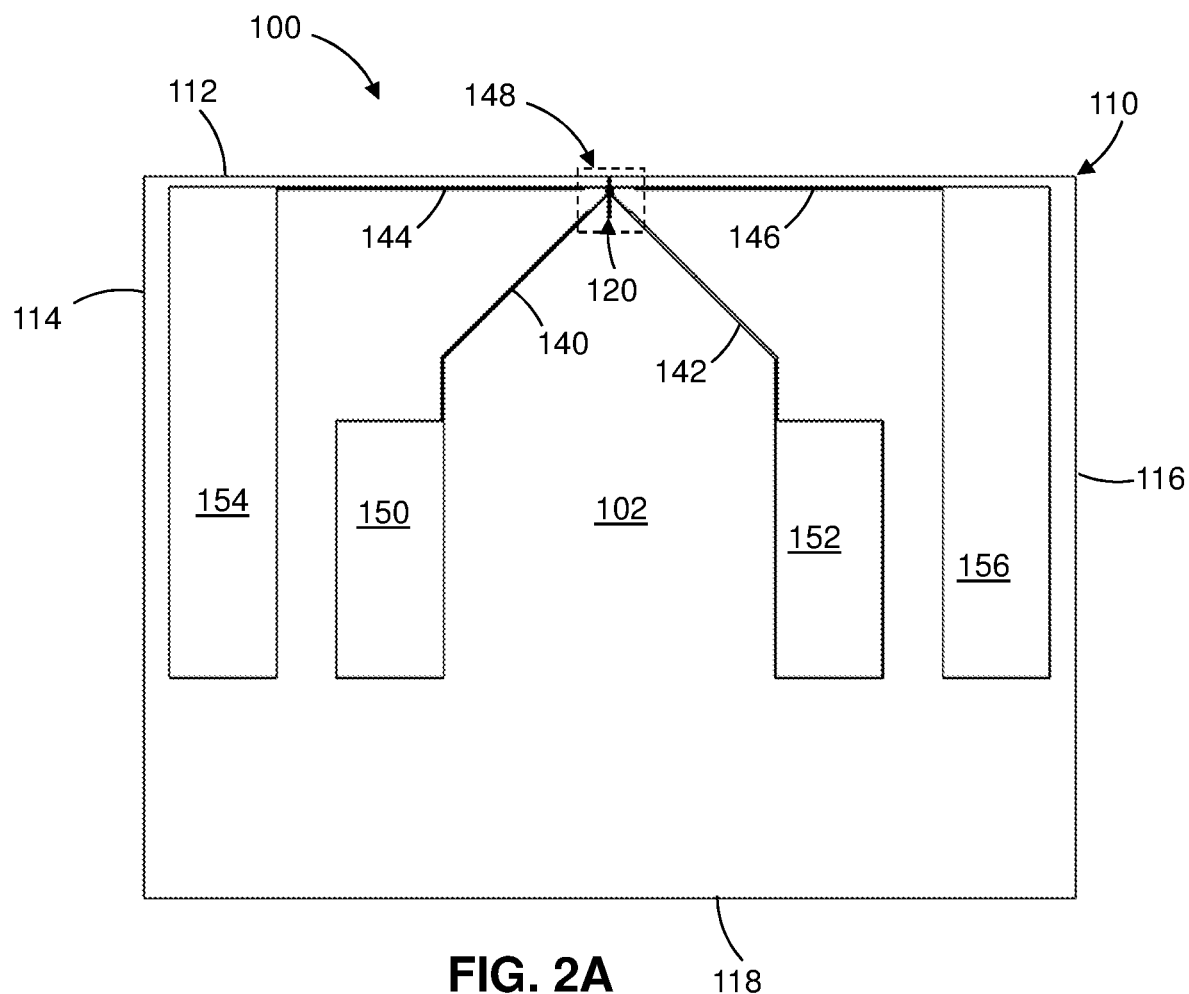
FIG. 2A is a plan view of a first side of an improved electrical device having a slit, according to at least one embodiment of the invention, for use in electrically stimulating and characterizing a sample during electron microscope imaging.

These descriptions are presented with sufficient details to provide an understanding of one or more particular embodiments of broader inventive subject matters. These descriptions expound upon and exemplify particular features of those particular embodiments without limiting the inventive subject matters to the explicitly described embodiments and features. Considerations in view of these descriptions will likely give rise to additional and similar embodiments and features without departing from the scope of the inventive subject matters. Although the term "step" may be expressly used or implied relating to features of processes or methods, no implication is made of any particular order or sequence among such expressed or implied steps unless an order or sequence is explicitly stated.

Any dimensions expressed or implied in the drawings and these descriptions are provided for exemplary purposes. Thus, not all embodiments within the scope of the drawings and these descriptions are made according to such exemplary dimensions. The drawings are not made necessarily to scale. Thus, not all embodiments within the scope of the drawings and these descriptions are made according to the apparent scale of the drawings with regard to relative dimensions in the drawings. However, for each drawing, at least one embodiment is made according to the apparent relative scale of the drawing. Like reference numbers used throughout the drawings depict like or similar elements. Unless described or implied as exclusive alternatives, features throughout the drawings and descriptions should be taken as cumulative, such that features expressly associated with some particular embodiments can be combined with other embodiments.

A sample testing portion of an electrical device 10, representative of the prior art, for use in electrically stimulating and characterizing a sample is shown in FIG. 1A. In use, the electrical device 10 would be mounted in the tip of a sample holder for placement of a sample in the beam of an electron microscope for imaging. The electrical device 10 includes a chip 12 upon or across which a thin electron-beam transparent or beam-penetrable nitride membrane 14 is mounted. For example, the chip 12 along the periphery of the membrane 14 is typically thicker than the thinner membrane and may have a hole or thinned area below the membrane. Thus, the chip 12 serves as a frame to the membrane.

Multiple electrically conductive wires 16-18 extend over the membrane 14 and lead from the illustrated area to corresponding electrical contact pads by which voltage and current are conveyed to and from the sample testing area of the electrical device 10, with each of the electrical wires 16-18 serving as a potentially separate signal carrying path.

In FIG. 1B, a sample 20 is placed across the wires 16-18 so as to be electrically stimulated and characterized. For example, a fixed or varying electrical voltage may be applied across the sample via the wires as electron beam imaging of the sample occurs. In order to promote or assure that the wires make electrical contact with the sample 20, in the illustrated example drop or bead-like electrically conductive formations 22-24 have been formed by metal deposition, for example using a focused ion beam (FIB).

While typically establishing good electrical communication between the sample 20 and wires 16-18, residual metal around the wires can also define conductive paths to and along inadvertently metallized portions of the membrane 14 below and near the deposited formations 22-24. Such alternative conductive paths represent unwanted electrical shorts or circuit paths that cause electrical leaking around the sample 20 and compromise electrical testing intended as through the sample 20.

The arrangements of FIGS. 1A-1B are representative of the prior art, for example particularly showing two wires 16-18 in FIG. 1B. Other numbers of wires, each intended for independent electrical connection to a sample are found in other exemplary arrangements. Furthermore, in some cases sample preparation is conducted using the electrical device 10 or similar device as a holder for sample material as the sample is cut. Both sample cutting and electrical connection steps can be conducted by FIB processes. Thus the problem of preventing unwanted conductive paths, for example by FIB metal deposition, represents a challenge that can arise several times as even just one sample is fabricated and placed upon the sample testing area of the electrical device 10.

Figure 2B:
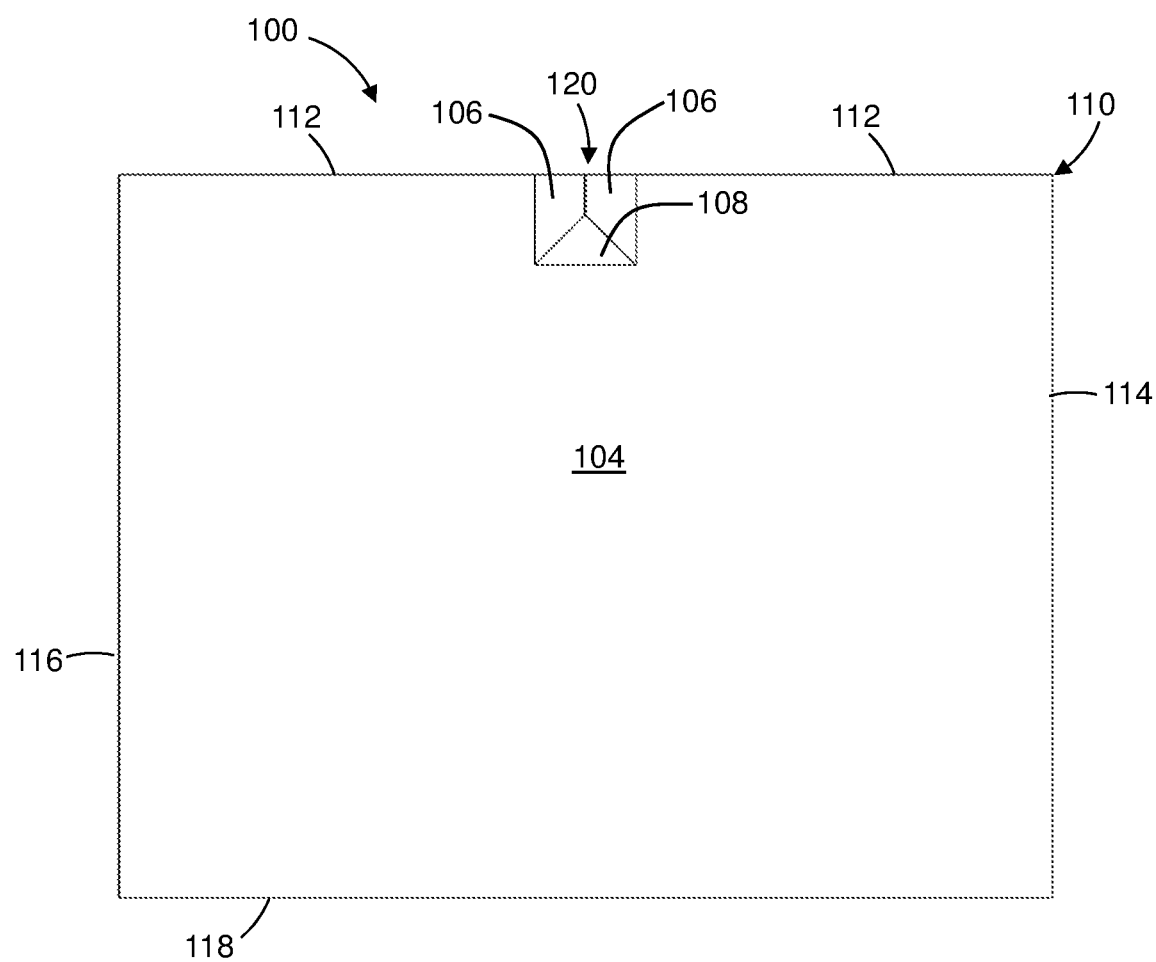
FIG. 2B is a plan view of a second side of the electrical device of FIG. 2A.
Figure 2C:
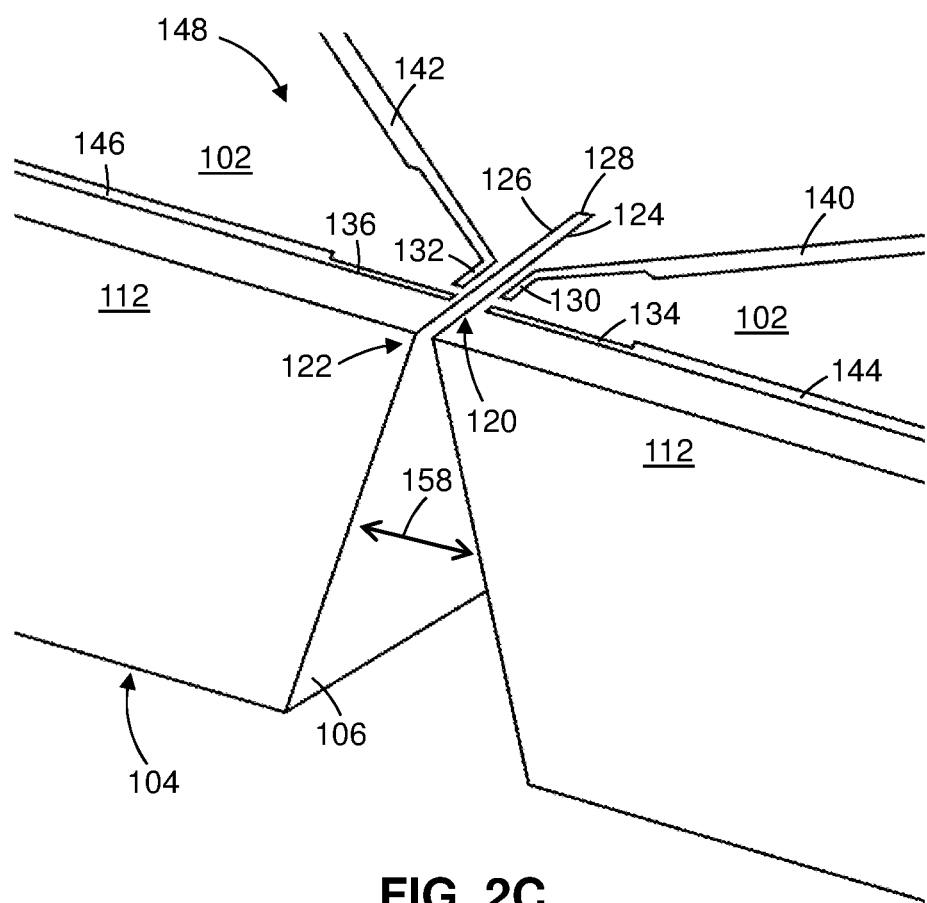
FIG. 2C is an enlarged perspective view of a forward portion of the electrical device of FIG. 2A.

An improved electrical device 100, according to at least one embodiment of the invention, for use in electrically stimulating and characterizing a sample is shown in FIG. 2A-2C. In use, the electrical device 100 would be mounted in the tip of a sample holder for placement of a sample in the beam of an electron microscope for imaging. The electrical device 100 includes a base chip 110 having a forward peripheral edge 112, opposing lateral peripheral edges 114 and 116, and rearward peripheral edge 118.

Advantageously, a slit 120 is formed through the chip 110 at a peripheral edge thereof. In the illustrated embodiment of FIGS. 2A-2C, the slit 120 is positioned centrally along the forward peripheral edge 112. The slit 120 is formed as linear, extending linearly from its open end 122 (FIG. 2C) at the forward peripheral edge 112 of the chip 110 toward the rearward peripheral edge 118 (FIGS. 2A-2B of the chip. The slit 120 has thus two opposing parallel lateral sides 124 and 126 that terminate at a closed end 128 (FIG. 2C), which is directed toward the rearward peripheral edge of the chip. The slit 120 is defined entirely through the chip 110 from the upper surface 102 (FIGS. 2A, 2C) to the lower surface 104 (FIG. 2B) opposite the upper surface. Thus a particle beam directed perpendicular to the generally planar upper surface 102 of the chip 110 can pass through the chip 110, if directed through slit 120, without striking the material of the chip or other components of the electrical device 100.

A forward portion 148 of the electrical device of FIG. 2A is shown in the enlarged perspective view of FIG. 2C. The slit 120 is open at the upper surface 102 and lower surface 104. The lateral width 158 of the slit 120 expands from the upper surface 102 (FIGS. 2A, 2C) to the lower surface 104 (FIG. 2B). The slit 120 may be formed by etching through the chip 110, which may be formed from a silicon wafer, from the lower surface 104. As the etching process deepens an etch cavity toward the upper surface 102, the cavity tapers between sloped planar side walls 106, and a sloped planar rearward end wall 108. At any etch depth, the bottom of the etch cavity corresponds to a 1-0-0 plane, and the slope angle relative to the normal of the 1-0-0 plane is known as the 1-1-1 angle, which is a known and well characterized angle (54.7 degrees) for wet-etched silicon wafers. Thus, the lateral width of the of the slit 120 at the upper surface 102 between the lateral sides 124 and 126 can be selected by calculation using 1-1-1 angle and the thickness of the chip 110 between the lower surface 104 and upper surface 102 thereof. The length of the slit 120 at the upper surface 102 from its open end 122 (FIG. 2C) to the closed end 128 also is governed by the 1-1-1 angle of the sloped rearward end wall 108.

Along each of the two lateral sides 124 and 126 of the slit 120, at least one electrically conductive contact, illustrated as a wire segment, extends as proximal to the slit. Thus, a sample can be placed across the slit 120 while electrically contacting at least one electrical wire on each side of the slit to define a circuit path that crosses the slit 120 via the sample. In the illustrated embodiment of FIG. 2C-2D, four electrically conductive contacts illustrated as wire segments 130-136 extend along the upper surface 102 of the chip 110. Each segment 130-136 is electrically connected to a longer conductive wire 140-146 that leads respectively to a corresponding electrical contact pad 150-156 (FIG. 2A) by which voltage and current can be conveyed to and from the electrical device 100, with each of the electrical wire segments 130-136 serving as a potentially separate signal carrying path between a sample and ancillary electronics external to the electrical device 100. Thus, the four electrically conductive contacts illustrated as wire segments 130-136 are electrically connected respectively to the electrical contact pads 150-156 by way of the conductive wires 140-146.

Figure 2D:
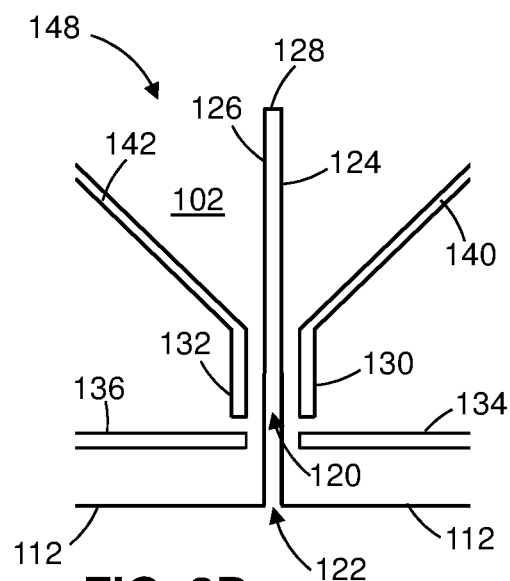
FIG. 2D is an enlarged view of the forward portion of the electrical device of FIG. 2A with a first arrangement of conducting wire segments for contacting a sample.
Figure 2E:
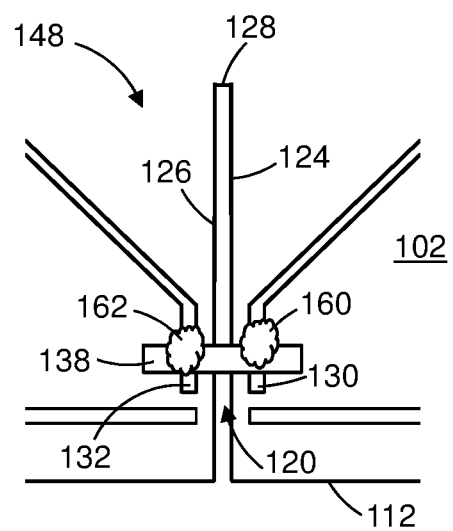
FIG. 2E is an enlarged view as in FIG. 2D, shown with a sample placed across the electrical device and electrically conducting formations deposited to assure electrical contact.

In the illustrated embodiment of FIGS. 2C-2E, two wire segments 130 and 132 extend as parallel to, and along opposite sides of, the slit 120. The wire segment 130 extends along the upper surface 102 of the chip 110 parallel to the first lateral side 124 of the slit 120, and offset from the slit 120 in the direction of the first lateral peripheral edge 114 (FIG. 2A) of the chip 110. Similarly, the wire segment 132 extends along the upper surface 102 of the chip 110 parallel to the second lateral side 126 of the slit 120, and offset from the slit 120 in the direction of the second lateral peripheral edge 116 (FIG. 2A) of the chip 110.

Furthermore, in the illustrated embodiment of FIGS. 2C-2E, two wire segments 134 and 136 extend as parallel to the forward peripheral edge 112 of the chip 110 and on opposite sides of the slit 120. Thus, the two wire segments 134 extend as perpendicular to the slit 120. The wire segment 134 extends along the upper surface 102 of the chip 110 parallel to the forward peripheral edge 112 and terminates proximal the first lateral side 124 of the slit 120 and laterally offset from the slit 120 in the direction of the first lateral peripheral edge 114 (FIG. 2A) of the chip 110. Similarly, the wire segment 136 extends along the upper surface 102 of the chip 110 parallel to the forward peripheral edge 112 and terminates proximal the second lateral side 126 of the slit 120 and laterally offset from the slit 120 in the direction of the second lateral peripheral edge 116 (FIG. 2A) of the chip 110.

The longer wires 140-146 that lead respectively to the corresponding electrical contact pads 150-156 (FIG. 2A) diverge from each other in extending from the wire segments 130-136. For example, the wires 144 and 146 extend, in opposite directions relative to each other, parallel to the forward peripheral edge 112 to the contact pads 154 and 156 (FIG. 2A) respectively. The wire 144, which is in electrical contact with or is an extension of the wire segment 134 extends in the direction of the first lateral peripheral edge 114 (FIG. 2A) of the chip 110. Similarly, the wire 146, which is in electrical contact with or is an extension of the wire segment 136 extends in the direction of the second lateral peripheral edge 116 (FIG. 2A) of the chip 110. The wire 140 extends laterally and rearward toward the first lateral peripheral edge 114 and rearward peripheral edge 118, ultimately routing to the contact pad 150. The wire 142 extends laterally and rearward toward the second lateral peripheral edge 116 and rearward peripheral edge 118, ultimately routing to the contact pad 152. Thus the wires 140-146 converge toward the area of the slit 120 and diverge in extending therefrom.

In FIG. 2E, a sample 138 is placed across the wire segments 130 and 132 so as to be electrically stimulated and characterized when the electrical device 100 is mounted in the tip of a sample holder and placed in the beam of an electron microscope for imaging. For example, varying electrical stimulations may be applied and measurements taken across the sample 138 via the wires 140 and 142 that extend from the wire segments 130 and 132 to the respectively corresponding electrical contact pads 150 and 152.

Drop or bead-like electrically conductive formations 160 and 162 have been formed by metal deposition, for example using a focused ion beam (FIB), in order to promote or assure that the wire segments make electrical contact with the sample 138 in the illustrated example. Due to the advantages of the improved electrical device 100, through which the slit 120 is formed, any likelihood of unwanted conductive paths being formed by electrical shorts or circuit paths that cause electrical leaking around the sample 138 is minimized or prevented. For example, because the slit 120 defines a material void, residual metal cannot accumulate to form a conductive bridge across the slit 120.

Advantageously, the slit 120 is defined entirely through the chip 110 from the upper surface 102 (FIGS. 2A, 2C) to the lower surface 104 (FIG. 2B) opposite the upper surface. In contrast to the slit 120, if a channel were defined only partially through the electrical device 100, unwanted metallization of the walls and floor of the channel might occur as conductive formations are applied to electrically connect a sample. Such unwanted metallization could bridge the channel. Thus the formation of a conductive path that permits electrical leaking around the sample may be possible if a channel were formed only partially through the electrical device 100. But because the slit 120 is formed entirely through the chip 110, a particle beam or other deposition pattern of particles directed toward the chip 110 can pass through the slit 120 without accumulation. Divergence of the wires 140-146 from the area of the slit 120 and wire segments 130-136 also advantageously minimizes or prevents unwanted connections or shorts. The parallel arrangement of the wire segments 130-132 relative to the slit 120 provides a tolerant range of placement of a sample.

The electrical device 100 is also advantageous in that the sample 138 is mounted near a peripheral edge, the forward peripheral edge 112 in particular in the illustrated example. Mounting a sample more centrally, for example as shown in FIG. 1B in which the sample 140 is mounted over the membrane 120, is more difficult, particularly when conductive formations are to be deposited such as by FIB process. Thus, the electrical device 100 is optimized for FIB treatment.

The sample 138 is shown in FIG. 2E as placed across the wire segments 130 and 132 so as to be electrically stimulated and characterized via the corresponding respective electrical contact pads 150 and 152 (FIG. 2A) by which voltage and current are conveyed to and from the sample 138. The sample 138 or another sample could otherwise or also be placed across the wire segments 134 and 136 so as to be electrically stimulated and characterized via the corresponding respective electrical contact pads 154 and 156.

Figure 2F:
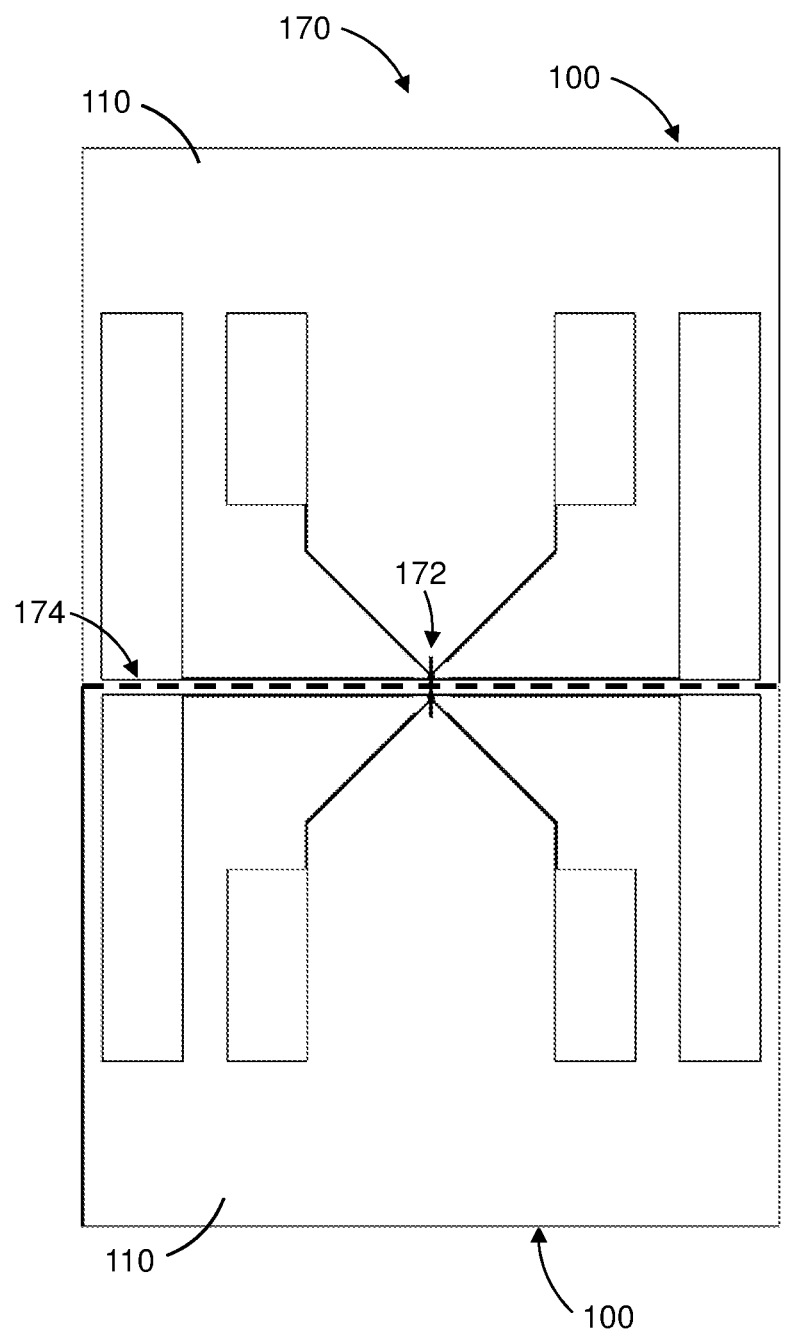
FIG. 2F is a plan view of a single large chip from which two electrical devices of FIG. 2A are diced in a method of fabrication according to at least one embodiment.

The electrical device 100 can be manufactured, for example, by preparing two such devices on a single chip 170. As shown in FIG. 2F, two electrical devices 100 are fabricated facing each other. For example, a large chip with a single membrane at its center may be first fabricated, with the membrane surrounded or framed by the large chip. The membrane can be grown, for example using silicon nitride, on a silicon wafer. The silicon can then be etched all the way through from the other side, with the etching stopping at the silicon nitride. By removing all of the silicon from under the silicon nitride, the silicon nitride membrane is formed. Any surfaces to be preserved from etching can be coated with a protective photoresist. In FIG. 2F, the membrane is formed as having a large central slit 172 in the large single chip 170. Two chips 110 are then diced from the large single chip 170 by passing a dicing blade through a center line 174 of the large chip, and the two end portions of the large central slit 172 effectively become the two edge slits 120 (FIG. 2D) of two separated electrical devices 100.

Figure 3A:
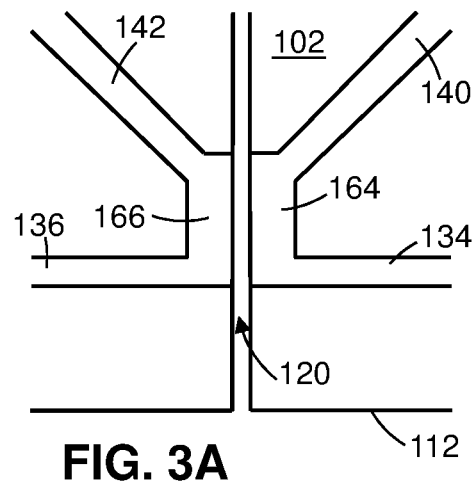
FIG. 3A is an enlarged view of the forward portion of an electrical device as in FIG. 2A shown with an alternative arrangement of sample-contacting elements.
Figure 3B:
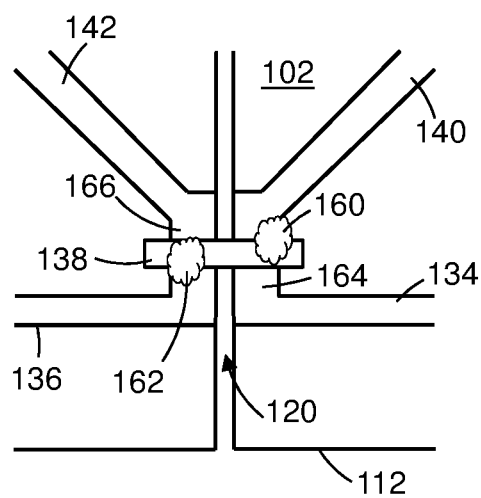
FIG. 3B is an enlarged view as in FIG. 3A, shown with a sample placed across the electrical device and electrically conducting formations deposited to assure electrical contact.

The forward portion 148 of the electrical device as in FIG. 2A is shown in FIGS. 3A-3B with an alternative arrangement of electrically-conductive elements for contacting a sample. In FIG. 3A, in lieu of the wire segments 130 and 132 shown for example in FIG. 2D, electrically conductive pads are positioned on opposing sides of the slit 120. A first electrically conductive pad 164 electrically links the wire segment 134 and wire 140 on the first lateral side of the slit 120. The wire 140 serves as a signal carrying path between the pad 164 and the contact pad 150. The wire 144 serves as signal carrying path between the pad 164 and the contact pad 154, via the wire segment 134.

A second electrically conductive pad 166 electrically links the wire segment 136 and wire 142 on the second lateral side of the slit 120. The wire 142 serves as signal carrying path between the pad 166 and the contact pad 152. The wire 146 serves as signal carrying path between the pad 166 and the contact pad 156, via the wire segment 136.

In FIG. 3B, the sample 138 is placed across the pads 164 and 166 so as to be electrically stimulated and characterized when the electrical device 100 is mounted in the tip of a sample holder and placed in the beam of an electron microscope for imaging. The drop or bead-like electrically conductive formations 160 and 162 have been formed to promote or assure that the pads 164 and 166 make electrical contact with the sample 138.

The surface 102 and the surface 104 are referenced herein as the "upper" surface 102 and "lower" surface 104 for purposes of identification. The electrical device 110 and its features and elements are not limited in fabrication, testing, or use to any absolute vertical or other orientation. In use when a sample is under electron microscope imaging, the upper surface 102 may generally face upward in the column of the microscope. In wet-etch fabrication of the slit 120 through the chip 110, an opposite orientation of the chip 110 may be preferred. Similarly, the peripheral edge 112 of the chip 110 is described herein as the "forward" peripheral edge 112 and the opposite peripheral edge 118 is described as the "rearward" peripheral edge 118 generally expecting the edge 112 and slit 120 formed therein will be directed, in use, into the column of the microscope in the tip of a sample holder.

In any particular moment of use or orientation, the electrical device 100 of FIG. 2A has a rectangular shape defined and extending longitudinally between the parallel peripheral edges 112 and 118, which define the forward most and rearward most portions of the electrical device respectively. The rectangular shape furthermore is defined and extends laterally between the parallel lateral peripheral edges 114 and 116, which are perpendicular to the longitudinally forward and rearward peripheral edges 112 and 118. The peripheral edges 112 and 118, and the peripheral edges 114 and 116, together define: the four sides of the rectangular peripheral shape of the electrical device 100; and a rectangular peripheral outer boundary interrupted only by the open end 122 of the slit 120. Due to the rectangular shape of the electrical device, the parallel and same-length peripheral edges 112 and 118 define the forward most and rearward most portions of the electrical device as having the same length.

Advantageously, in the illustrated embodiment, no portion of the electrical device 100 extends outward or forward from the forward peripheral edge 112, which is linear between the lateral peripheral edges 114 and 116 of the device 100, and is interrupted therebetween only by the open end 122 of the slit 120. Thus, the electrical device 100 can be conveniently fabricated as described with reference to FIG. 2F.

Figure 4A:
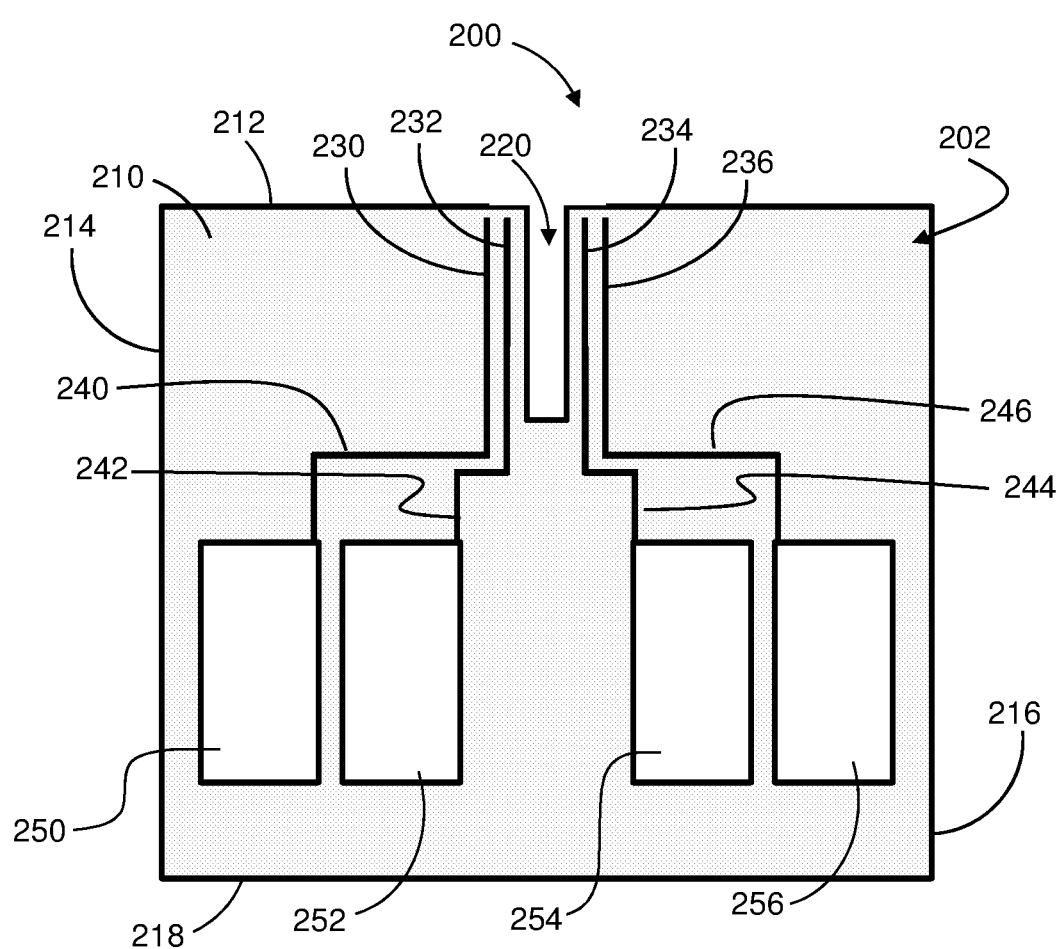
FIG. 4A is a plan view of an improved electrical device, according to at least one other embodiment of the invention, for use in electrically stimulating and characterizing a sample during electron microscope imaging.

In another embodiment, an improved electrical device 200 for use in electrically stimulating and characterizing a sample is shown in FIG. 4A. In use, the electrical device 200 would be mounted in the tip of a sample holder for placement of a sample in the beam of an electron microscope for imaging. The electrical device 200 includes a base chip 210 having a forward peripheral edge 212, opposing lateral peripheral edges 214 and 216, and rearward peripheral edge 218.

Advantageously, a slit 220 is formed through the chip 210 at a peripheral edge thereof. In the illustrated embodiment of FIG. 4A, the slit 220 is positioned centrally along the forward peripheral edge 212. The slit 220 is formed as linear, extending linearly from its open end 222 (FIG. 4C) at the forward peripheral edge 212 of the chip 210 toward the rearward peripheral edge 218 of the chip. The slit 220 has thus two opposing parallel lateral sides 224 and 226 that terminate at a closed end 228, which is directed toward the rearward peripheral edge 218 of the chip. The slit 220 is formed entirely through the chip 210 from the upper surface 202 to the lower surface opposite the upper surface. Thus a particle beam directed perpendicular to the generally planar upper surface 202 of the chip 200 can pass through the chip 200, if directed through slit 220, without striking the material of the chip 210 or other components of the electrical device 200.

Along each of the two lateral sides 224 and 226 of the slit 220, at least one electrically conductive contact, illustrated as a wire segment, extends as proximal and parallel to the slit. Thus, a sample can be placed across the slit 220 while electrically contacting at least one electrical wire on each side of the slit to define a circuit path that crosses the slit 220 via the sample. In the illustrated embodiment of FIG. 4A, four electrically conductive wire segments 230-236 extend along the upper surface 202 of the chip 210. Each segment 230-236 is a respective forward portion of a longer wire 240-246 that leads respectively to a corresponding electrical contact pad 250-256 by which voltage and current are conveyed to and from the sample testing area of the electrical device 200, with each of the electrical wire segments 230-236 serving as a potentially separate signal carrying path between a sample and ancillary electronics external to the electrical device 200. In the illustrated embodiment, two laterally spaced wire segments 230 and 232 extend as parallel to the first lateral side 224 (FIG. 4C), and two laterally spaced wire segments 234 and 236 extend as parallel to the second lateral side 226, with the inner wire segments 232 and 234 positioned between the two more outer wire segments 230 and 236.

Figure 4B:
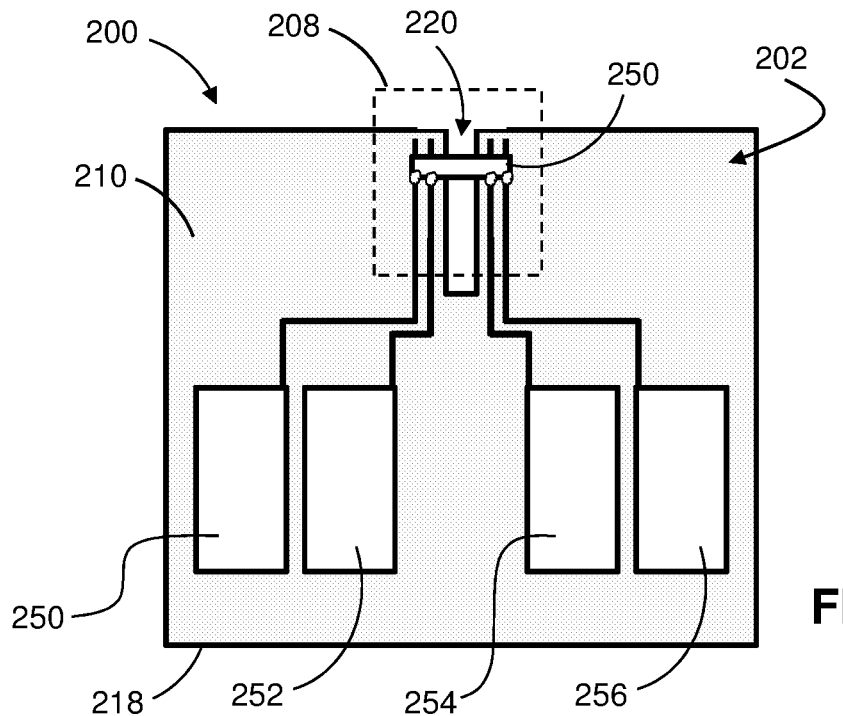
FIG. 4B is a plan view a sample placed across the electrical device of FIG. 4A and electrically conducting formations deposited to assure electrical contact.

In FIG. 4B, a sample 250 is placed across the wire segments 230-236 so as to be electrically stimulated and characterized when the electrical device 200 is mounted in the tip of a sample holder and placed in the beam of an electron microscope for imaging. For example, varying electrical stimulations may be applied and measurements taken across the sample 250 via the wires 240-246 that extend from their forward wire segments 230-236 to the respectively corresponding electrical contact pads 250-256.

Figure 4C:
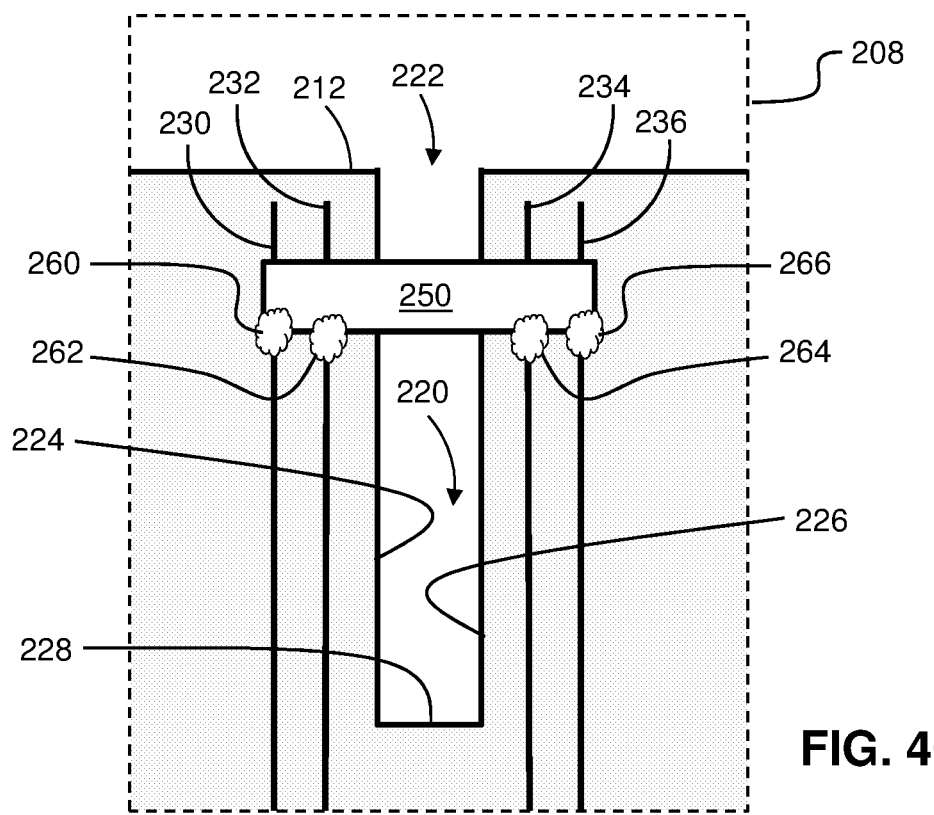
FIG. 4C is an enlarged view of the forward portion of the electrical device and sample of FIG. 4A.

FIG. 4C is a close-up view of the forward portion 208 of the electrical device 200 and sample of FIG. 4B, showing in further detail the sample 250 and drop or bead-like electrically conductive formations 260-266 (FIG. 4C) that have been formed by metal deposition, for example using a focused ion beam (FIB), in order to promote or assure that the wire segments make electrical contact with the sample 250, in the illustrated example. Due to the advantages of the improved electrical device 200, through which the slit 220 is formed, any likelihood of unwanted conductive paths being formed by electrical shorts or circuit paths that cause electrical leaking around the sample 250 is minimized or prevented.

The electrical devices 100 (FIGS. 2A-2C) and 200 (FIG. 4) are illustrated as having four forward wire segments for connection to a sample for a four-point measurement, and the slits 120 and 220 are positioned centrally along the forward peripheral edges 112 and 212 of the chips 110 and 210, respectively. Other examples of electrical devices within the scope of the descriptions have other arrangements and features. The placement and positions of edge slits can vary in various embodiments as optimized to serve various uses, modes of mounting samples, and ways of viewing samples in electron microscopes.

Figure 5:
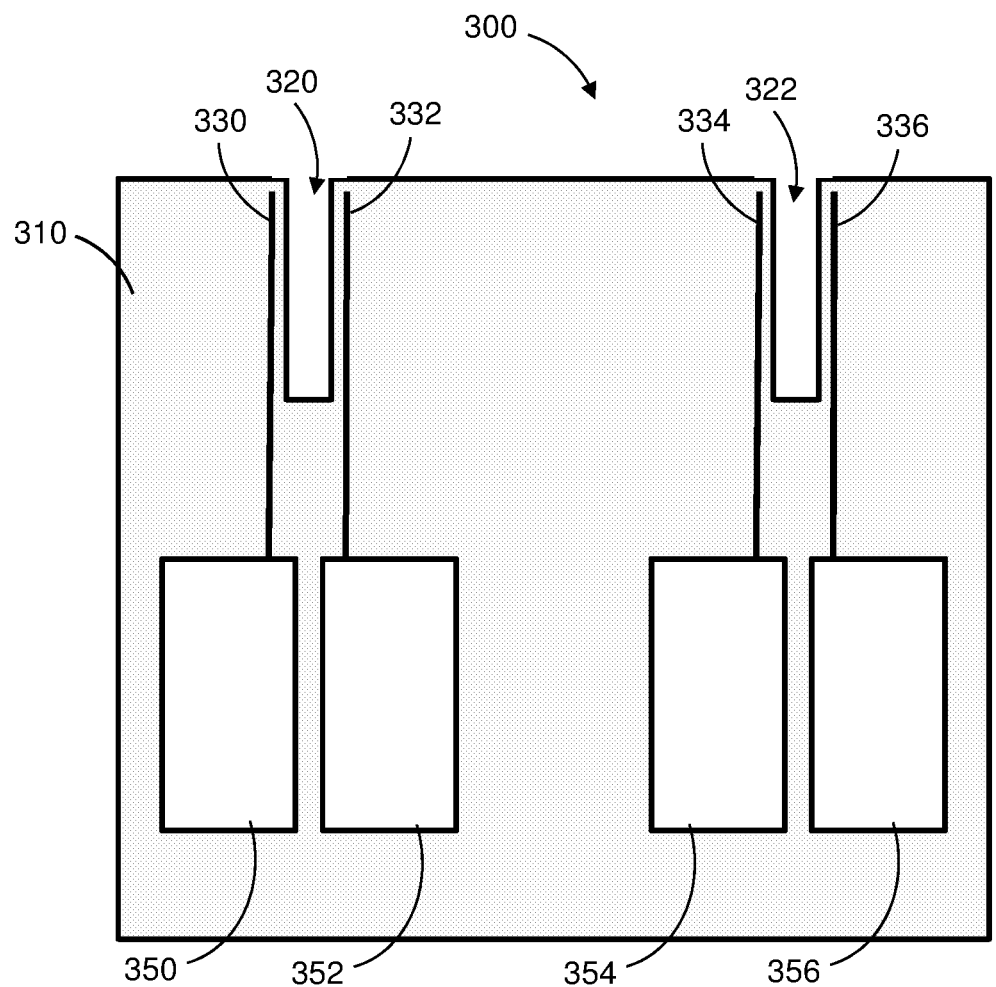
FIG. 5 is a plan view of an improved electrical device, according to at least one other embodiment of the invention, for use in electrically stimulating and characterizing a sample during electron microscope imaging.

For example, FIG. 5 is a plan view of an improved electrical device 300, according to at least one embodiment of the invention, for use in electrically stimulating and characterizing samples during electron microscope imaging. In FIG. 5, two slits 320 and 322 are formed in the forward peripheral edge of a chip 310. The first slit 320 is flanked along its two lateral sides by two respective electrically conductive wires 330-332. Similarly, the second slit 322 is flanked along its two lateral sides by two respective electrically conductive wires 334-336. Each wire 330-336 leads respectively to a corresponding electrical contact pads 350-356 by which voltage and current are conveyed to and from the sample testing area of the electrical device 300, with each of the electrical wires 330-336 serving as a potentially separate signal carrying path between a sample and ancillary electronics external to the electrical device 300.

Figure 6:
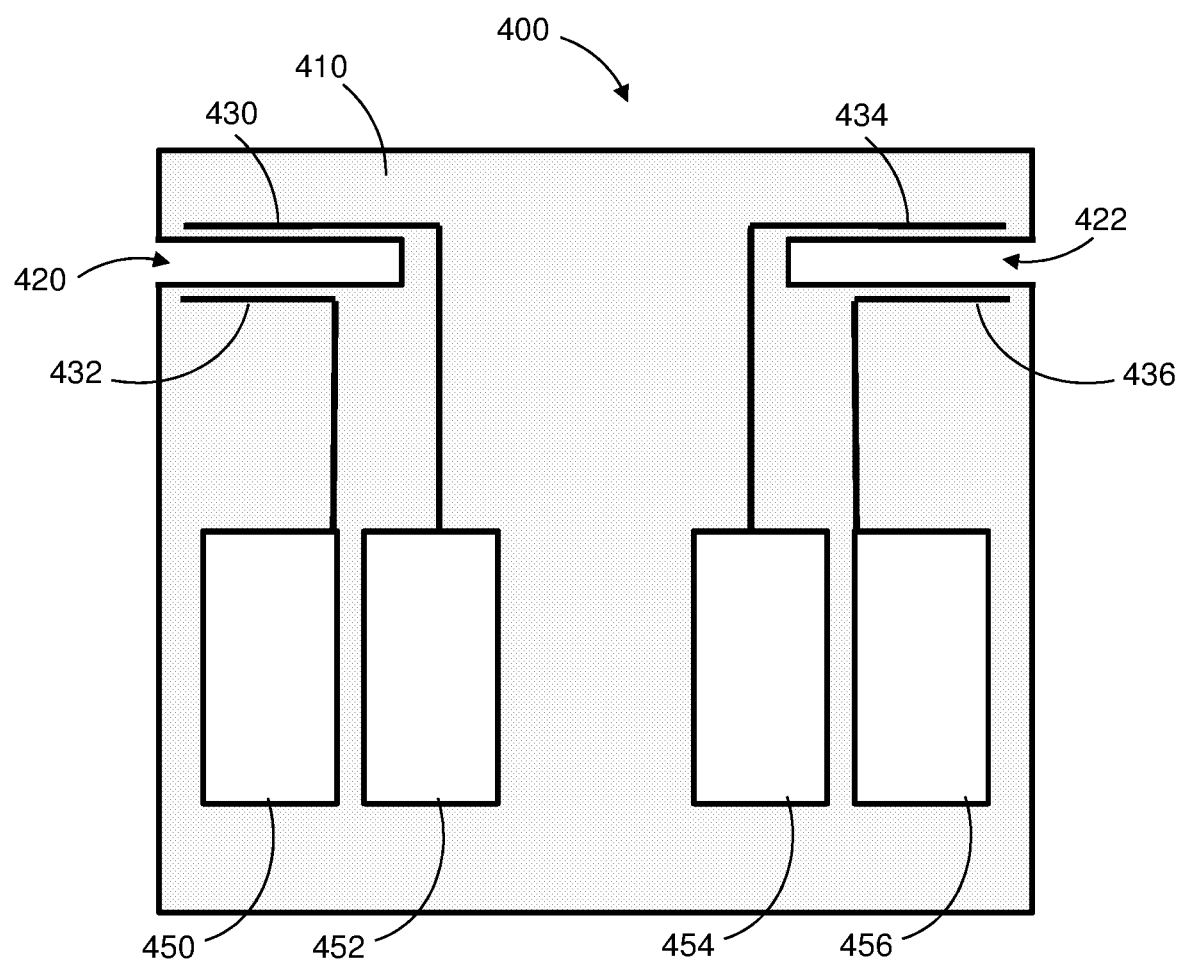
FIG. 6 is a plan view of an improved electrical device, according to yet another embodiment of the invention, for use in electrically stimulating and characterizing samples during electron microscope imaging.

FIG. 6 is a plan view of an improved electrical device 400, according to at least one other embodiment of the invention, for use in electrically stimulating and characterizing samples during electron microscope imaging. In FIG. 6, two slits 420 and 422 are formed in opposing respective lateral peripheral edges of a chip 410. The first slit 420 is flanked along its two sides by two respective electrically conductive wire segments 430-432. Similarly, the second slit 422 is flanked along its two sides by two respective electrically conductive wire segments 434-436. Each wire segment 430-436 is electrically connected to a respectively corresponding electrical contact pad 450-456 by which voltage and current are conveyed to and from the sample testing area of the electrical device 400, with each of the electrical wire segments 430-436 serving as a potentially separate signal carrying path between a sample and ancillary electronics external to the electrical device 400.

Particular embodiments and features have been described with reference to the drawings. It is to be understood that these descriptions are not limited to any single embodiment or any particular set of features, and that similar embodiments and features may arise or modifications and additions may be made without departing from the scope of these descriptions and the spirit of the appended claims.

What is claimed is:

1. An electrical device for electrically measuring a sample during electron microscope imaging, the electrical device comprising:
    a chip through which a slit is defined, the chip having at least one peripheral edge, the slit having an open end at the at least one peripheral edge;
    an electrically conductive first contact on the chip; and
    an electrically conductive second contact on the chip;
    wherein the slit is at least partially positioned between the first contact and the second contact, and
    wherein the slit is defined entirely through the chip and defines a material void such that an electron beam can pass completely through the chip during electron microscope imaging to measure the sample.

2. The electrical device of claim 1, further comprising:
an electrically conductive first wire extending along the chip and electrically connected to the first contact; and
an electrically conductive second wire extending along the chip and electrically connected to the second contact,
wherein the first wire and second wire diverge from each other in extending along the chip away from the slit.

3. The electrical device of claim 2, further comprising:
an electrically conductive first pad electrically connected to the first contact through the first wire; and
an electrically conductive second pad electrically connected to the second contact through the second wire.

4. The electrical device of claim 2, wherein the first wire and second wire extend away from the slit in opposite directions relative to each other.

5. The electrical device of claim 1, wherein the electrical device has a rectangular shape defined by:
the at least one peripheral edge defining a linear peripheral first edge;
a linear peripheral second edge parallel to the first edge;
a linear peripheral third edge perpendicular to the first edge and the second edge; and
a linear peripheral fourth edge parallel to the third edge.

6. The electrical device of claim 5, wherein the first edge, the second edge, the third edge, and the fourth edge together define a rectangular peripheral outer boundary of the chip interrupted only by the open end of the slit.

7. The electrical device of claim 1, wherein:
the at least one peripheral edge is linear and defines a forward-most portion of the electrical device having a first length;
wherein the electrical device further comprises a second linear peripheral edge, which is parallel to the at least one peripheral edge and defines a rearward-most portion of the electrical device having a second length; and the first length and the second length are essentially the same.

8. The electrical device of claim 1, wherein the at least one peripheral edge is interrupted along the first length only by the open end of the slit.

9. The electrical device according to claim 1, wherein the slit has two opposing parallel sides and terminates at a closed end.

10. The electrical device according to claim 9, wherein the slit is defined entirely through the chip and defines a material void.

11. The electrical device according to claim 1, wherein:
the chip comprises a planar first surface, and an opposite planar second surface parallel to the first surface; and
the slit defined through the chip is open at the first surface and second surface.

12. The electrical device according to claim 11, wherein the slit expands from the first surface to the second surface.

13. The electrical device according to claim 12, wherein the first contact and the second contact are mounted on or over the first surface.

14. The electrical device according to claim 12, wherein, between the first surface and the second surface, the slit is defined between sloped planar side walls.

15. The electrical device of claim 1, further comprising an electrically conductive third contact and an electrically conductive fourth contact positioned on the chip with the slit at least partially between the third contact and the fourth contact.

16. The electrical device of claim 15, wherein the first contact and the second contact are essentially parallel to the slit.

17. The electrical device of claim 16, wherein the third contact and the fourth contact are essentially perpendicular to the slit.

* * * * *